(12) United States Patent
Chung et al.

(10) Patent No.: US 10,978,660 B2
(45) Date of Patent: *Apr. 13, 2021

(54) DEVICE WITH QUANTUM DOT EMISSIVE LAYER AND DISPLAY DEVICE COMPRISING THE SAME

(71) Applicant: SAMSUNG ELECTRONICS CO., LTD., Suwon-si (KR)

(72) Inventors: Dae Young Chung, Suwon-si (KR); Eun Joo Jang, Suwon-si (KR); Oul Cho, Suwon-si (KR); Hyun A Kang, Suwon-si (KR); Tae Hyung Kim, Seoul (KR); Yun Sung Woo, Yongin-si (KR); Jeong Hee Lee, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/797,380

(22) Filed: Feb. 21, 2020

(65) Prior Publication Data

US 2020/0194703 A1   Jun. 18, 2020

Related U.S. Application Data

(63) Continuation of application No. 15/483,651, filed on Apr. 10, 2017, now Pat. No. 10,615,356.

(30) Foreign Application Priority Data

Aug. 23, 2016 (KR) .................. 10-2016-0107064

(51) Int. Cl.
*H01L 51/50* (2006.01)
*H01L 51/52* (2006.01)

(52) U.S. Cl.
CPC ........ *H01L 51/502* (2013.01); *H01L 51/5215* (2013.01); *H01L 51/5218* (2013.01);
(Continued)

(58) Field of Classification Search
CPC . H01L 51/502; H01L 51/515; H01L 51/5218; H01L 51/5275; H01L 51/5265; H01L 51/5262; H01L 51/5231
See application file for complete search history.

(56) References Cited

U.S. PATENT DOCUMENTS 4,766,048 A    8/1988   Hisamura
7,309,956 B2  12/2007   Raychaudhuri et al.
(Continued)

FOREIGN PATENT DOCUMENTS

GB    2465730 A    6/2010
KR  100835059 B1   6/2008
(Continued)

OTHER PUBLICATIONS

European Search Report dated Feb. 1, 2018, of the corresponding European Patent Application No. 17186686.6.
(Continued)

*Primary Examiner* — Allen L Parker
*Assistant Examiner* — Gustavo G Ramallo
(74) *Attorney, Agent, or Firm* — Cantor Colburn LLP

(57) ABSTRACT

An electronic device includes a first electrode and a second electrode facing each other, an emission layer comprising a plurality of quantum dots, wherein the emission layer is disposed between the first electrode and the second electrode; a first charge auxiliary layer disposed between the first electrode and the emission layer; and an optical functional layer disposed on the second electrode on a side opposite the emission layer, wherein the first electrode includes a reflecting electrode, wherein the second electrode is a light-transmitting electrode, wherein a region between the optical functional layer and the first electrode comprises a micro-
(Continued)

cavity structure, and a refractive index of the optical functional layer is greater than or equal to a refractive index of the second electrode.

25 Claims, 9 Drawing Sheets

(52) U.S. Cl.
CPC ...... *H01L 51/5265* (2013.01); *H01L 51/5275* (2013.01); *H01L 51/5231* (2013.01); *H01L 51/5262* (2013.01); *H01L 2251/5353* (2013.01)

(56) References Cited

U.S. PATENT DOCUMENTS

| | | | |
|---|---|---|---|
| 7,816,677 | B2 | 10/2010 | Lee et al. |
| 7,833,633 | B2 | 11/2010 | Lee et al. |
| 8,367,218 | B2 | 2/2013 | Chen et al. |
| 9,276,168 | B2 | 3/2016 | Coe-Sullivan et al. |
| 10,522,787 | B1 | 12/2019 | Montgomery et al. |
| 2002/0084747 | A1 | 7/2002 | Fujieda et al. |
| 2007/0001581 | A1 | 1/2007 | Stasiak et al. |
| 2008/0023272 | A1 | 1/2008 | Takeda et al. |
| 2008/0023724 | A1 | 1/2008 | Takeda et al. |
| 2009/0009057 | A1 | 1/2009 | Lee et al. |
| 2009/0087546 | A1 | 4/2009 | Ilzumi et al. |
| 2009/0212688 | A1 | 8/2009 | Song et al. |
| 2009/0302750 | A1 | 12/2009 | Jun et al. |
| 2013/0193416 | A1 | 8/2013 | Shin |
| 2014/0014896 | A1 | 1/2014 | Chung et al. |
| 2014/0110665 | A1* | 4/2014 | Zhang ................. H01L 51/5092 257/13 |
| 2015/0069366 | A1 | 3/2015 | Lunt et al. |
| 2015/0228700 | A1 | 8/2015 | Cho et al. |
| 2015/0228850 | A1 | 8/2015 | Zheng et al. |
| 2015/0236075 | A1 | 8/2015 | Jeong |
| 2015/0287846 | A1 | 10/2015 | Helander et al. |
| 2016/0005989 | A1* | 1/2016 | Gu ......................... C09K 11/08 257/13 |
| 2016/0164039 | A1 | 6/2016 | Im |
| 2016/0329515 | A1 | 11/2016 | Fleissner et al. |
| 2017/0170406 | A1 | 6/2017 | Choi et al. |

FOREIGN PATENT DOCUMENTS

| | | |
|---|---|---|
| KR | 1020090087274 A | 8/2009 |
| KR | 20140010719 A | 1/2014 |
| KR | 1020140097775 A | 8/2014 |

OTHER PUBLICATIONS

Haowen Liang, et al., "High efficiency quantum dot and organic LEDs with a back-cavity and a high index substrate", J. Phys. D: Appl. Phys. 49 (2016) 145103.

Xuyong Yang, et al., "Light Extraction Efficiency Enhancement of Colloidal Quantum Dot Light-Emitting Diodes Using Large-Scale Nanopillar Arrays", Adv. Funct. Mater. 2014, 24, 5977-5984.

* cited by examiner

CIE x: 0.162, CIE y: 0.014

CIE x: 0.141, CIE y: 0.054

DEVICE WITH QUANTUM DOT EMISSIVE LAYER AND DISPLAY DEVICE COMPRISING THE SAME

CROSS-REFERENCE TO RELATED APPLICATION

This application is a continuation of U.S. patent application Ser. No. 15/483,651, filed on Apr. 10, 2017, which claims priority to and the benefit of Korean Patent Application No. 10-2016-0107064 filed in the Korean Intellectual Property Office on Aug. 23, 2016, and all the benefits accruing therefrom under 35 U.S.C. § 119, the entire contents of which in their entireties are incorporated herein by reference.

BACKGROUND

1. Field

An electronic device and a display device including the same are disclosed.

2. Description of the Related Art

Quantum dots are a nanocrystal semiconductor material having a diameter of less than or equal to around 10 nm, and show quantum confinement effects. Quantum dots generate stronger intensity light in a narrower wavelength region than the commonly used phosphor. Quantum dots emit light while the excited electrons are transited from a conduction band to a valence band and emitted wavelengths vary based on a particle size of the quantum dots. Quantum dots can therefore be used obtain light in a desirable wavelength region by adjusting the size of the quantum dots.

Advantages to electronic devices having an emission layer including quantum dots include reduced production costs compared to organic light emitting diode (OLED) devices using an emission layer including phosphorescence and/or phosphor material. Additionally, different colors may be emitted by changing the size of the quantum dots, whereas OLED devices require the use of different organic materials in the emission layer for each emitted color of light.

The luminous efficiency of the emission layer including quantum dots is determined by an external quantum efficiency of quantum dots, a balance of charge carrier, and light extraction efficiency, and the like. There remains a need to improve the luminous efficiency of the quantum dot emission layer to provide more advanced electronic devices.

SUMMARY

An embodiment provides an electronic device having excellent luminous efficiency by improving light extraction efficiency, and a display device including the same.

According to an embodiment, an electronic device includes a first electrode and a second electrode facing each other; an emission layer including a plurality of quantum dots, wherein the emission layer is disposed between the first electrode and the second electrode; a first charge auxiliary layer disposed between the first electrode and the emission layer; and an optical functional layer disposed on the second electrode on a side opposite the emission layer, wherein the first electrode includes a reflecting electrode, wherein the second electrode is a light-transmitting electrode, wherein a region between the optical functional layer and the first electrode comprises a microcavity structure, and wherein a refractive index of the optical functional layer is greater than or equal to a refractive index of the second electrode.

The refractive index of the optical functional layer may range from about 1.5 to about 2.5.

The optical functional layer may include a triarylamine compound, a diarylamine compound, a carbazole compound, or a combination thereof.

The emission layer may emit a blue light, and a thickness of the optical functional layer may range from about 40 nanometers to about 60 nanometers.

The emission layer may emit a red light, and a thickness of the optical functional layer may range from about 70 nanometers to about 95 nanometers.

The first charge auxiliary layer may include at least one electron transport layer.

The at least one electron transport layer may include a zinc oxide, a molybdenum oxide, a tungsten oxide, a nickel oxide, or a combination thereof.

The emission layer may emit a blue light, and a thickness of the at least one electron transport layer may range from about 25 nanometers to about 45 nanometers.

The emission layer may emit a red light, and a thickness of the at least one electron transport layer may range from about 45 nanometers to about 80 nanometers.

The first electrode may include a first layer having a work function of about 4.2 electron volts to about 4.7 electron volts, and an optically opaque second layer.

The first layer may include an indium-tin oxide, an indium-zinc oxide, magnesium-silver, aluminum-lithium, magnesium-indium, an indium oxide, a tin oxide, a gallium oxide, a zinc oxide, or a combination thereof, and the second layer may include silver, aluminum, zinc, gold, iridium, copper, platinum, or a combination thereof.

The second layer may include silver, aluminum, zinc, gold, iridium, copper, platinum, or a combination thereof.

The quantum dots may include a Group II-VI compound, a Group III-V compound, a Group IV-VI compound, a Group IV compound, a Group II-III-VI compound, a Group I-II-IV-VI compound, or a combination thereof.

According to another embodiment, a display device includes a first electronic device including a first quantum dot emitting light in a first wavelength region; a second electronic device including a second quantum dot emitting light in a shorter second wavelength region than the first wavelength region; and a third electronic device including a third quantum dot emitting light in a shorter third wavelength region than the second wavelength region, wherein each of the first electronic device, the second electronic device, and the third electronic device further includes a first electrode and a second electrode facing each other, an emission layer disposed between the first electrode and the second electrode, wherein the emission layer includes the first quantum dot, the second quantum dot, or the third quantum dot, a charge transport layer disposed between the emission layer and the first electrode, and an optical functional layer disposed on the second electrode on a side opposite the emission layer, wherein the first electrode includes a reflecting electrode, wherein the second electrode is a light-transmitting electrode, wherein a region between the optical functional layer and the first electrode comprises a micro cavity structure, wherein a refractive index of the optical functional layer is greater than or equal to a refractive index of the second electrode, and wherein a thickness of the charge transport layer of the first electronic device, a thickness of the charge transport layer of the second electronic device, and a thickness of the charge transport layer of the third electronic device are different.

The refractive index of the optical functional layer may range from about 1.5 to about 2.5.

The thickness of the charge transport layer of the first electronic device may be greater than the thickness of the charge transport layer of the second electronic device and the thickness of the charge transport layer of the third electronic device.

The thickness of the charge transport layer of the third electronic device may be less than the thickness of the charge transport layer of the second electronic device.

The thickness of the charge transport layer of the first electronic device may range from about 45 nanometers to about 80 nanometers, and the thickness of the charge transport layer of the third electronic device may range from about 25 nanometers to about 45 nanometers.

The thickness of the optical functional layer of the first electronic device, the thickness of the optical functional layer of the second electronic device, and the thickness of the optical functional layer of the third electronic device may be different.

The thickness of the optical functional layer of the first electronic device may be greater than the thickness of the optical functional layer of the second electronic device and the thickness of the optical functional layer of the third electronic devices.

The thickness of the optical functional layer of the third electronic device may be less than the thickness of the optical functional layer of the second electronic device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
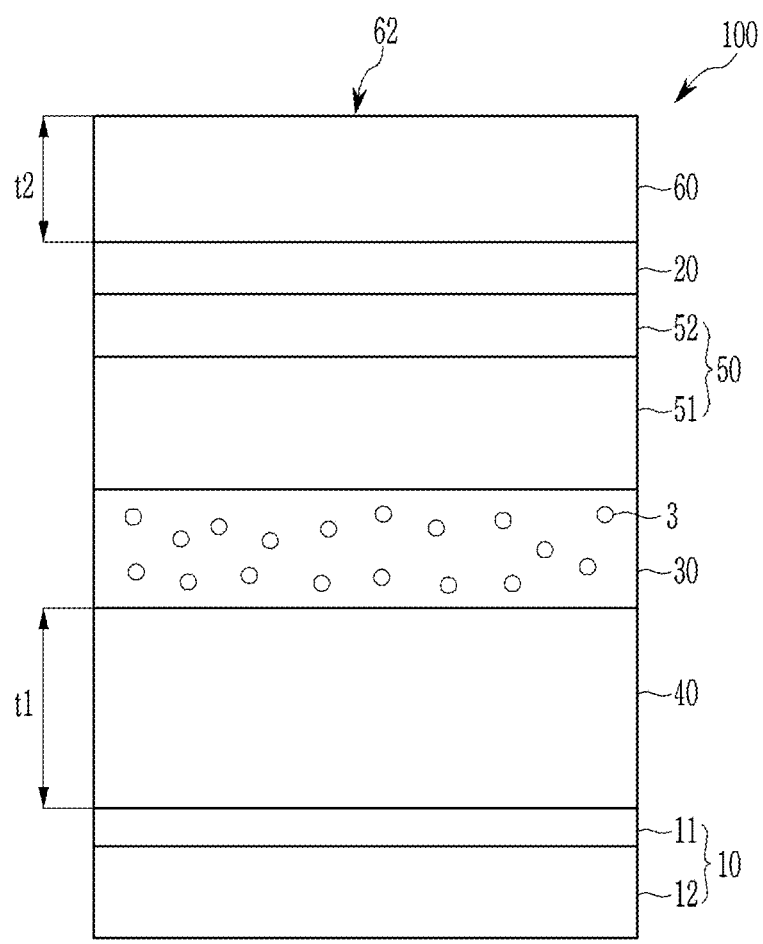
FIG. 1 is a schematic cross-sectional view of an electronic device according to an embodiment.

Embodiments of the present disclosure will hereinafter be described in detail with reference to the accompanying drawings, in which various embodiments are shown. However, this disclosure may be embodied in many different forms, and is not to be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic cross-sectional view of an electronic device 100 according to an embodiment.

An electronic device 100 according to an embodiment includes a first electrode 10 and a second electrode 20 facing each other, an emission layer 30 including a plurality of quantum dots 3, wherein the emission layer is disposed between the first electrode 10 and the second electrode 20, a first charge auxiliary layer 40 disposed between the first electrode 10 and the emission layer 30, a second charge auxiliary layer 50 disposed between the emission layer 30 and the second electrode 20, and an optical functional layer 60 disposed on the second electrode 20 on a side opposite the emission layer 30. That is, the optical functional layer 60 and the emission layer 30 are on opposite sides of the second electrode 20. In an embodiment, the electronic device 100 does not include the second charge auxiliary layer 50.

The electronic device 100 may be an electro-luminescence device capable of generating light by flowing current to the emission layer 30 including the plurality of quantum dots 3 through the first electrode 10 and the second electrode 20. The electronic device 100 may generate light in a variety of wavelength regions depending upon the types of quantum dots in the plurality of quantum dots 3 included in the emission layer 30.

In an embodiment, as the first electrode 10 includes a reflecting electrode, and the second electrode 20 includes a light-transmitting electrode. In the electronic device 100, the light generated from the emission layer 30 may be emitted to the outside of the electronic device 100 through the upper side 62 of the optical functional layer 60 as shown in FIG. 1.

Even though not shown in FIG. 1, the first electrode 10 may be disposed directly on a suitable substrate. As the first electrode 10 includes a material having a high reflectivity, it may reflect incident light that reaches to the first electrode 10. In an embodiment, the first electrode 10 may act as a cathode. The first electrode 10 is paired with the second electrode 20 acting as an anode to flow a current through the emission layer 30.

In an embodiment, the first electrode 10 may include a first layer 11 having a work function of about 4.2 electron volts (eV) to about 4.7 eV, and an optically opaque second layer 12. In an embodiment, the first layer 11 of the first electrode 10 has a work function of about 4.2 eV to about 4.6 eV, about 4.2 eV to about 4.5 eV, about 4.2 eV to about 4.4 eV, about 4.3 eV to about 4.7 eV, about 4.4 eV to about 4.7 eV, or about 4.5 eV to about 4.7 eV.

The first layer 11 may be directly connected to a driving power source so may function to flow current to the emission layer 30. The first layer 11 may be formed on the second layer 12 with reference to FIG. 1. The first layer 11 may be an optically transparent conductive material. Thereby, a portion of the light generated from the emission layer 30 may be passed through the first layer 11 and entered to the second layer 12. In an embodiment, the first layer 11 may include an indium (In)-tin (Sn) oxide, an indium (In)-zinc (Zn) oxide, magnesium (Mg)-silver (Ag), aluminum (Al)-lithium (Li), magnesium (Mg)-indium (In), an indium (In) oxide, a tin (Sn) oxide, a gallium (Ga) oxide, a zinc (Zn) oxide, or a combination thereof, and the second layer 12 may include silver (Ag), aluminum (Al), zinc (Zn), gold (Au), iridium (Ir), copper (Cu), platinum (Pt), or a combination thereof.

The second layer 12 may include a metal having a high reflectivity. In an embodiment, the second layer 12 may include silver (Ag), aluminum (Al), zinc (Zn), gold (Au), iridium (Ir), copper (Cu), platinum (Pt), or a combination thereof. Thereby, the light generated from the emission layer 30 is entered into the first layer 11 to an interface between the first layer 11 and the second layer 12, and reflected and returned to the emission layer 30. In other words, the second layer 12 may function as the reflecting electrode.

The second electrode 20 may be an optically transparent material, so it may act as a light-transmitting electrode so that the light generated from the emission layer 30 may be transmitted through the second electrode 20. In an embodiment, the second electrode 20 may include lithium, magnesium, aluminum, aluminum-lithium, calcium, magnesium-indium, magnesium-silver, or a combination thereof.

The emission layer 30 may include a plurality of quantum dots 3. The emission layer 30 may be formed by coating a resin into which the plurality of quantum dots 3 is dispersed, and curing the same.

The emission layer 30 is where the electrons and holes are delivered by the current supplied by the first electrode 10 and the second electrode 20. The electrons and holes recombine in the emission layer 30 to generate an exciton, and the generated exciton may emit light, at a wavelength corresponding to the size of the quantum dots in the plurality of quantum dots 3, while being transited from an excited state to a ground state.

As quantum dots 3 have a discontinuous energy bandgap by the quantum confinement effect, it may convert the incident light to light at a predetermined wavelength and emit the same. Thereby, the emission layer 30 including the plurality of quantum dots 3 may generate light having excellent color reproducibility and color purity. For example, the light emitted by the plurality of quantum dots 3 may have a narrow full width at half maximum (FWHM).

In an embodiment, the material of the plurality of quantum dots 3 is not particularly limited and includes any suitable quantum dot material, including those which are known in the art and/or commercially available. For example, the quantum dots may include a Group II-VI compound, a Group III-V compound, a Group IV-VI compound, a Group IV compound, a Group II-III-VI compound, a Group I-II-IV-VI compound, or a combination thereof.

For example, the quantum dots may include a Group II-VI compound, a Group III-V compound, a Group IV-VI compound, a Group IV compound, or a combination thereof.

The Group II-VI compound may be selected from a binary element compound selected from CdSe, CdTe, ZnS, ZnSe, ZnTe, ZnO, HgS, HgSe, HgTe, MgSe, MgS, and a combination thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from a binary element compound selected from GaN, GaP, GaAs, GaSb, AlN, AlP, AlAs, AlSb, InN, InP, InAs, InSb, and a combination thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a combination thereof; and a quaternary element compound selected from GaAlNP, GaAlNAs, GaAlNSb, GaAlPAs, GaAlPSb, GaInNP, GaInNAs, GaInNSb, GaInNAs, GaInPSb, InAlNP, InAlNAs, InAlNSb, InAlPAs, InAlPSb, and a combination thereof. The Group IV-VI compound may be selected from a binary element compound selected from SnS, SnSe, SnTe, PbS, PbSe, PbTe, and a combination thereof; a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

The Group IV compound may include a single-element compound selected from Si, Ge, and a combination thereof; and a binary element compound selected from SiC, SiGe, and a combination thereof.

The binary element compound, the ternary element compound or the quaternary element compound respectively exist in a uniform concentration in the quantum dot particle or in partially different concentrations in the same quantum dot particle. The quantum dots may have a core-shell structure wherein one quantum dot in the plurality of quantum dots 3 surrounds another quantum dot in the plurality of quantum dots 3. The core and shell may each have an interface, and an element of at least one of the core and the shell in the interface may have a concentration gradient wherein the concentration of the element(s) of the shell decreases toward the core. In addition, the plurality of quantum dots 3 may have one core of a quantum dot and multiple shells (i.e., multi-shell) surrounding the core. The multi-shell structure has at least two shells wherein each shell may be a single composition, an alloy, or a shell having a concentration gradient.

In the plurality of quantum dots 3, the quantum dot materials of the shell may have a larger energy bandgap than the bandgap energy of the core, and thereby the quantum dot may exhibit a quantum confinement effect more effectively. In case of a multi-shell type structure, the bandgap of the material of an outer shell may be of higher energy than the bandgap energy of the material of an inner shell that is closer to the core. In this case, the plurality of quantum dots 3 may emit light of a wavelength ranging from ultraviolet (UV) to infrared (IR) light.

The plurality of quantum dots 3 may have quantum efficiency (QE) of greater than or equal to about 10%, for example, greater than or equal to about 30%, greater than or equal to about 50%, greater than or equal to about 60%, greater than or equal to about 70%, or greater than or equal to about 90%.

The quantum dots in the plurality of quantum dots 3 may be formed of the same materials or different materials. In addition, the quantum dots of the plurality of quantum dots 3 may have the same size or a different size from one another.

The plurality of quantum dots 3 has characteristics such as emitting light in all directions. In the emission layer 30 including the plurality of quantum dots 3, it may be difficult to control the transport path of light in one predetermined direction. However, the electronic device 100 according to an embodiment may include a transport path of light so that light is emitted (e.g., directed) to the outside of the electronic device 100 through the second electrode 20 which is a light-transmitting electrode, as the first electrode 10 includes the second layer 12 which is a reflecting electrode.

In an embodiment, the optical functional layer 60 may be formed on the second electrode 20 on a side opposite the emission layer 30. The optical functional layer 60 may include an optically transparent material, but may also function as a transflective layer which passes a portion of light that is at or near the wavelength corresponding to the predetermined resonance wavelength or wavelengths and reflects the remaining portions of light that are emitted from the emission layer. Thus, in an embodiment, a microcavity structure may be formed in a region between the optical functional layer 60 and the first electrode 10 including the reflecting electrode.

The microcavity structure means that the portion of light at a predetermined wavelength or wavelengths is amplified due to the constructive interference caused by repeatedly reflecting light between a reflecting layer and a transflective layer across an optical length. In the electronic device 100 according to an embodiment, the first electrode 10 may function as a reflecting layer, and the optical functional layer 60 may function as a transflective layer. In other words, among the light generated from the emission layer 30, the portion of light near to the wavelength(s) corresponding to the resonance wavelength(s) of the microcavity is reinforced by the optical functional layer 60, and the other portion of light at other wavelengths are suppressed.

Thus, the electronic device 100 in which the microcavity is formed by the optical functional layer 60 and the first electrode 10, for example, may amplify the portion of light corresponding to the objective wavelength range within the visible light wavelength range and emit the same to the outside.

The wavelength range of light that is reinforced, for example amplified, by the microcavity may be determined by the physical properties of the materials in the electronic device 100, the optical properties of the transflective layer, an optical length between the transflective layer and the reflecting layer, and the like. More specifically, the properties of the microcavity of the electronic device 100 according to an embodiment may be preliminarily determined in part by a refractive index of the optical functional layer 60 which is a transflective layer. The optical functional layer 60 is not totally reflective at least at the interface with the second electrode 20, so the refractive index of the optical functional layer 60 may be the same as the refractive index of the second electrode 20, or the refractive index of the optical functional layer 60 may be greater than the refractive index of the second electrode 20.

Meanwhile, the optical functional layer 60 according to an embodiment may have a refractive index of, for example, greater than or equal to about 1.2, for example, greater than or equal to about 1.5, for example, greater than or equal to about 1.7, for example, greater than or equal to about 2.2, and the refractive index may be, for example, less than or equal to about 2.8, for example, less than or equal to about 2.6, for example, less than or equal to about 2.5. In an embodiment, the refractive index may be about 1.2 to about 2.8, about 1.5 to about 2.6, about 1.7 to about 2.5, about 2.2 to about 2.8, about 2.2 to about 2.6, or about 2.2 to about 2.5. As optical functional layer 60 has this refractive index, the electronic device 100 according to an embodiment may form a microcavity structure in the region between the optical functional layer 60 and the second layer 12 of the first electrode 10.

In an embodiment, the light wavelength range reinforced, for example amplified, by the microcavity may be also determined by the particular material(s) of the optical functional layer 60 and/or the thickness of the optical functional layer 60, in addition to the refractive index of the optical functional layer 60.

The optical functional layer 60 according to an embodiment may include an organic material including: a triarylamine-based compound including a triarylamine group in which the same or different aryl groups of the three aryl groups are substituted, a diarylamine-based compound including a diarylamine group in which same or different aryl groups of the two aryl groups are substituted, a carbazole-based compound in which the same or different aryl groups of the two aryl groups are substituted in the carbazole structure, or a combination thereof.

In an embodiment, the optical functional layer 60 may have a thickness t2 of, for example, greater than or equal to about 30 nanometers (nm), for example, greater than or equal to about 35 nm, for example, greater than or equal to about 40 nm, and for example, less than or equal to about 100 nm, for example, less than or equal to about 95 nm, for example, less than or equal to about 90 nm, for example, less than or equal to about 85 nm. In an embodiment, the optical functional layer 60 may have a thickness t2 of about 30 nm to about 100 nm, about 35 nm to about 95 nm, or about 40 nm to about 85 nm.

If the optical functional layer 60 satisfies at least one of the described conditions, it may function as a transflective layer for the predetermined wavelength region within a visible light wavelength region.

In an embodiment, when the emission layer 30 of the electronic device 100 emits a blue light, for example, the optical functional layer 60 may have a thickness of greater than or equal to about 30 nm, for example, greater than or equal to about 35 nm, for example, greater than or equal to about 40 nm, and for example, less than or equal to about 70 nm, for example, less than or equal to about 65 nm, for example, less than or equal to about 60 nm, for example, less than or equal to about 55 nm. In an embodiment, the emission layer 30 emits a blue light and the optical functional layer 60 has a thickness of about 30 nm to about 70 nm, about 35 nm to about 65 nm, about 40 nm to about 60 nm, or about 40 nm to about 55 nm.

In an embodiment, when the emission layer 30 of the electronic device 100 emits a red light, for example, the optical functional layer 60 may have a thickness of greater than or equal to about 65 nm, for example, greater than or equal to about 70 nm, for example, greater than or equal to about 75 nm, and for example, less than or equal to about 100 nm, for example, less than or equal to about 95 nm, for example, less than or equal to about 90 nm, for example, less than or equal to about 85 nm. In an embodiment, the emission layer 30 emits a red light and the optical functional layer 60 has a thickness of about 65 nm to about 100 nm, about 70 nm to about 95 nm, about 75 nm to about 90 nm, or about 75 nm to about 85 nm.

In an embodiment, the wavelength range of light reinforced, for example amplified, by the microcavity may be determined by an optical length. The optical length corresponds to a distance between the first electrode 10 and the optical functional layer 60.

A first charge auxiliary layer 40 and a second charge auxiliary layer 50 are auxiliary layers (FIGS. 1 and 2) for improving the luminous efficiency of the emission layer 30, which function to control the charge carrier balance in the electronic device 100.

In an embodiment, the first charge auxiliary layer 40 and the second charge auxiliary layer 50 receive a current from the first electrode 10 and the second electrode 20, respectively, to generate holes or electrons, and function to transfer the holes and the electrons to the emission layer 30, respectively. The first charge auxiliary layer 40 may include an electron injecting and/or transporting layer, and the second charge auxiliary layer 50 may include a hole injecting and/or transporting layer.

In an embodiment, the first charge auxiliary layer 40 is an electron transport layer configured to transport electrons to the emission layer 30; the second charge auxiliary layer 50 may include a hole injection layer 52 configured to inject holes into the emission layer 30 and a hole transport layer 51 configured to transport holes to the emission layer 30.

The hole transport layer 51 and the hole injection layer 52 may respectively include, for example, at least one selected from poly(3,4-ethylenedioxythiophene):poly(styrene sulfonate) (PEDOT:PSS), poly(9,9-dioctylfluorene-co-N-(4-butylphenyl)diphenylamine) (TFB), polyarylamine, poly (N-vinylcarbazole), polyaniline, polypyrrole, N,N,N',N'-tetrakis(4-methoxyphenyl)-benzidine (TPD), 4-bis[N-(1-naphthyl)-N-phenylamino]biphenyl (α-NPD), 4,4',4"-tris[phenyl(m-tolyl)amino]triphenylamine (m-MTDATA), 4,4', 4"-tris(N-carbazolyl)triphenylamine (TCTA), 1,1-bis[(di-4-tolyl amino)phenyl]cyclohexane (TAPC), and a combination thereof, but are not limited thereto, and may be selected according an energy level inside the electronic device 100.

The electronic device 100 according to an embodiment is operated in an inverted method and may have a top emission structure emitting light through the optical functional layer 60, for example through the upper side 62 of the optical functional layer 60. However, the operating method and the emission structure of the electronic device 100 according to an embodiment are not necessarily limited thereto.

Meanwhile, as described above, an optical length which is one of the conditions for determining the properties of a microcavity. In an embodiment, the optical length corresponds to a distance between the first electrode 10 and the optical functional layer 60, and is affected by the thickness of the emission layer 30, the thickness of the first charge auxiliary layer 40, and the thickness of the second charge auxiliary layer 50. In an embodiment, in the electronic device 100 the optical length of the microcavity may be determined by the thickness t1 of the first charge auxiliary layer 40, instead of the thickness of the emission layer 30 or the thickness of the second charge auxiliary layer 50.

This is because the electronic device 100 according to an embodiment uses the emission layer 30 including the plurality of quantum dots 3 having isotropically luminous radiating characteristics.

Figure 2:
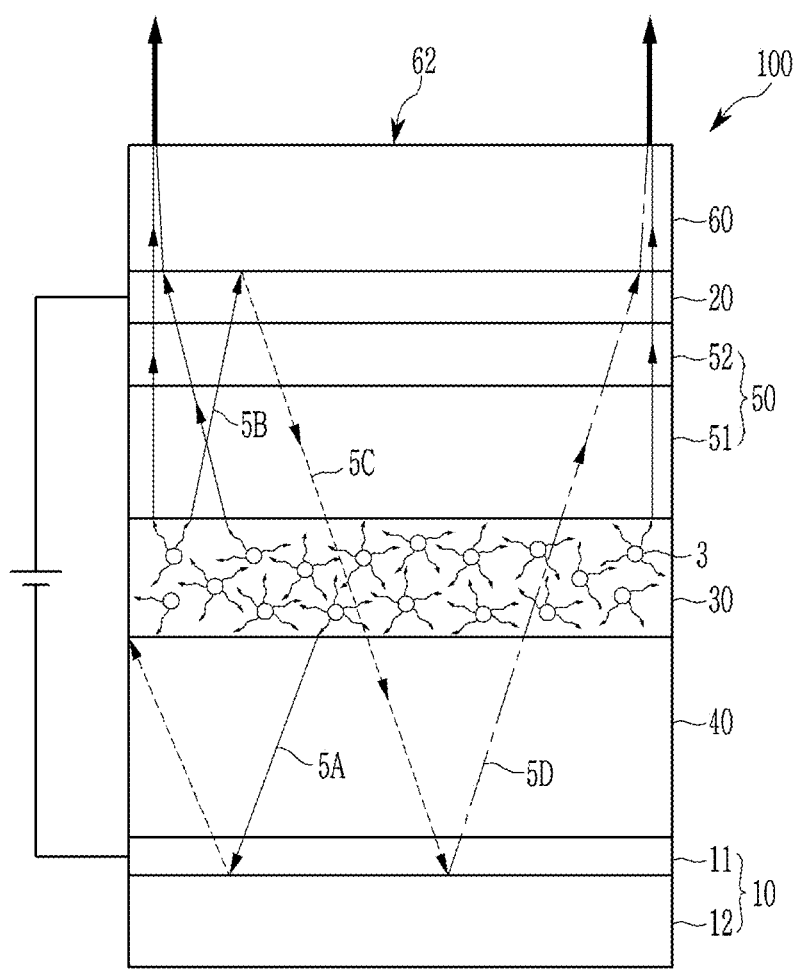
FIG. 2 is a schematic cross-sectional view of a light transport path in an electronic device according to an embodiment.

FIG. 2 is a cross-sectional view schematically showing the various exemplary light transporting paths in the electronic device 100 according to an embodiment.

Referring to FIG. 2, the plurality quantum dots 3 radiates light in all directions due to the isotropic light radiating characteristics. A part of the light is transported in a direction 5A to the second layer 12 of the first electrode 10, which is a reflecting electrode. In addition, a part of the generated light is transported in a direction 5B to the optical functional layer 60 and reflected in a direction 5C towards the second layer 12 of the first electrode 10, and then reflected in a direction 5D from the second layer 12 and transported to the optical functional layer 60. The light radiated by the plurality of quantum dots 3 is resonated by repeatedly reflecting between the second layer 12 and the optical functional layer 60 in the electronic device 100 and then amplified into light of a predetermined wavelength(s), and this light is ultimately emitted to the outside of the electronic device 100.

Looking to the light transporting paths in FIG. 2, the number of paths passing through the first charge auxiliary layer 40 is greater than the number of paths passing through each of the emission layer 30 and the second charge auxiliary layer 50 according to the repeating resonance pathways. Thereby, the paths of passing light through the first charge auxiliary layer 40 may determine the optical length of microcavity. That is, according to an embodiment, the optical length of the microcavity is the distance between the optical functional layer 60 and the second layer 12 of the first electrode 10, and is measured along the light transporting paths 5C and 5D as shown in FIG. 2.

The first charge auxiliary layer 40 of the electronic device 100 according to an embodiment is an electron transport layer, and the electron transport layer may include a zinc (Zn) oxide, a molybdenum (Mo) oxide, a tungsten (W) oxide, a nickel (Ni) oxide, a zirconium (Zr) oxide, a titanium (Ti) oxide, a nickel (Ni) oxide, a tin (Sn) oxide, or a combination thereof.

In an embodiment, the electron transport layer may have a thickness t1 of, for example, greater than or equal to about 20 nm, or for example, greater than or equal to about 25 nm, and for example, less than or equal to about 85 nm, for example, less than or equal to about 70 nm, for example, less than or equal to about 65 nm. In an embodiment, the thickness t1 is about 20 nm to about 85 nm, about 25 nm to about 70 nm, or about 25 nm to about 65 nm. By adjusting the material and/or the thickness of the first charge auxiliary layer 40 as describe above, the electronic device 100 according to an embodiment may emit light reinforced by microcavity.

In an embodiment, when the emission layer 30 of the electronic device 100 emits a red light, the first charge auxiliary layer 40 may have a thickness of, for example, greater than or equal to about 40 nm, for example, greater than or equal to about 45 nm, for example, greater than or equal to about 50 nm, and for example, less than or equal to about 70 nm, for example, less than or equal to about 65 nm. In an embodiment, the emission layer 30 emits a red light and the thickness of the first charge auxiliary layer 40 is about 40 nm to about 70 nm, about 45 nm to about 65 nm, or about 50 nm to about 65 nm.

In an embodiment, when the emission layer 30 of the electronic device 100 emits a blue light, the first charge auxiliary layer 40 may have a thickness of, for example, greater than or equal to about 20 nm, for example, greater than or equal to about 25 nm, and for example, less than or equal to about 50 nm, for example, less than or equal to about 45 nm, for example, less than or equal to about 40 nm. In an embodiment, the emission layer 30 emits a blue light and the thickness of the first charge auxiliary layer 40 is about 20 nm to about 50 nm, about 25 nm to about 45 nm, or about 25 nm to about 40 nm.

When the emission layer 30 including the plurality of quantum dots 3 is applied to an electro-luminescence structure, unlike the general organic light emitting diode, the electronic device 100 has a very low light extraction efficiency of about 25% due to the isotropically luminous radiating characteristics of the plurality of quantum dots 3. In addition, as the organic light emitting diode may readily control the balance of the charge carrier by adjusting the inner elements of the device, it can provide a microcavity, but in a case of the quantum dot electro-luminescence device including the plurality of quantum dots 3, it is difficult to variously design the balance of the charge carrier by adjusting only the inner elements of the electronic device, so that the forming of a microcavity is more difficult.

However, the electronic device 100 according to an embodiment includes the optical functional layer 60, which is a transflective layer, disposed on the inside of the electronic device 100, so that a micro cavity is formed in the quantum dot electro-luminescence device, and also the wavelength region of the microcavity may be further controlled by adjusting the thickness of the first charge auxiliary layer 40. Accordingly, the electronic device 100 according to an embodiment may have an excellent luminous efficiency since both the external quantum efficiency (EQE) and the light extraction efficiency are improved.

In addition, the electronic device according to an embodiment may emit light having a narrower full width at half maximum (FWHM) and a less distortion of conduction band due to the defects, than the organic light emitting diode, so the emitted light may have a high color reproducibility and a high color purity.

Hereinafter, a display device 1000 including an electronic device according to an embodiment is described with reference to FIG. 3.

Figure 3:
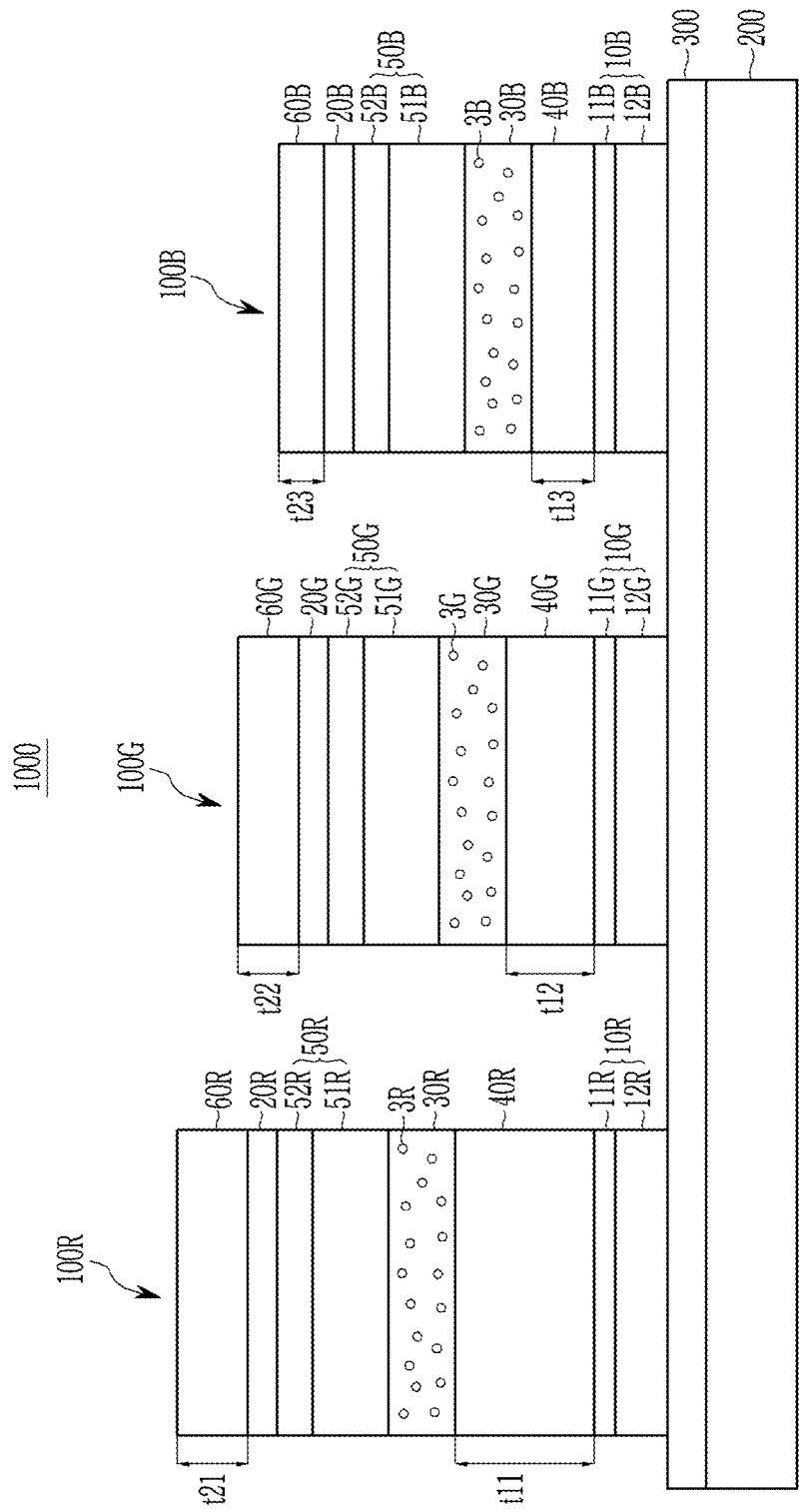
FIG. 3 is a schematic cross-sectional view of a display device including an electronic device according to an embodiment.

FIG. 3 is a schematic cross-sectional view of a display device including an electronic device according to an embodiment.

The display device 1000 according to an embodiment includes a substrate 200, a driving circuit 300 formed on the substrate 200, and a first electronic device 100R, a second electronic device 100G, and a third electronic device 100B spaced apart from each other in a predetermined interval and disposed on the driving circuit 300.

The first to third electronic devices 100R, 100G, and 100B have the same structure as in the electronic device 100, but the wavelengths of the lights emitted from each of the plurality of quantum dots 3R, 3G, and 3B are different from each other.

In an embodiment, the first electronic device 100R is a red device emitting a red light, the second electronic device 100G is a green device emitting a green light, and the third electronic device 100B is a blue device emitting a blue light. In other words, the first to third electronic devices 100R, 100G, 100B may be pixels expressing red, green, and blue, respectively, in the display device 1000.

However, an embodiment is not necessarily limited thereto, but the first to third electronic devices may respectively express magenta, yellow, cyan, or may express other colors.

The substrate 200, which is a transparent insulation substrate, may be a soft material. The substrate 200 may include glass or a polymer material in a film having a glass transition temperature (Tg) of greater than about 150° C. For example, it can include a COC (cycloolefin copolymer) or a COP (cycloolefin polymer) based material.

The driving circuit 300 is disposed on the substrate 200 and independently connected with each of the first to third electronic devices 100R, 100G, and 100B. The driving circuit 300 may include at least one line including a scan line, a data line, a driving power source line, a common power source line, and the like, at least two of thin film transistors (TFT) connected to the wire and corresponding to one organic light emitting diode, and at least one capacitor, or the like. The driving circuit 300 may have a variety of suitable structures, including the known structures in the art.

According to an embodiment, each of the first to third electronic devices 100R, 100G, and 100B may each independently have a refractive index of, for example, greater than or equal to about 1.2, for example, greater than or equal to about 1.5, for example, greater than or equal to about 1.7, for example, greater than or equal to about 2.2, and the refractive index may be, for example, less than or equal to about 2.8, for example, less than or equal to about 2.6, for example, less than or equal to about 2.5. In an embodiment, the first to third electronic devices 100R, 100G, and 100B may each independently have a refractive index of about 1.2 to about 2.8, about 1.5 to about 2.6, about 1.7 to about 2.5, or about 2.2 to about 2.5. As all the optical functional layers 60R, 60G, and 60B of each device have the refractive index, the devices may form each microcavity through the optical functional layer 60R, 60G, and 60B and the second layers 12R, 12G, and 12B.

In an embodiment, as lights emitted from each of the first to third electronic devices 100R, 100G, and 100B have different wavelength regions, the thickness of the optical functional layer 60R, 60G, and 60B and/or the thickness of the first charge transport layer 40R, 40G, and 40B may be different from each other.

For example, the thickness t11 of the first charge transport layer 40R of the first electronic device may be greater than, for example thicker than, the thicknesses t12 and t13 of the first charge transport layers 40G and 40B of other electronic devices. In addition, the thickness t13 of the first charge transport layer 40B of the third electronic device may be less than, for example thinner than, the thickness t12 of the charge transport layer 40G of the second electronic device.

For example, the thickness t11 of the charge transport layer 40R of the first electronic device may be, for example, greater than or equal to about 40 nm, for example, greater than or equal to about 45 nm, for example, greater than or equal to about 50 nm, and for example, less than or equal to about 70 nm, for example, less than or equal to about 65 nm. In an embodiment, the thickness t11 can be about 40 nm to about 70 nm, about 45 nm to about 65 nm, or about 50 nm to about 65 nm.

In addition, for example, the thickness t13 of the charge transport layer 40B of the third electronic device may be for example, greater than or equal to about 20 nm, for example, greater than or equal to about 25 nm, and for example, less than or equal to about 50 nm, for example, less than or equal to about 45 nm, for example, less than or equal to about 40 nm. In an embodiment, the thickness t13 can be about 20 nm to about 50 nm, about 25 nm to about 45 nm, or about 25 nm to about 40 nm.

In addition, for example, the thickness t21 of the optical functional layer 60R of the first electronic device may be greater than, for example thicker than, the thicknesses t22 and t23 of the optical functional layers 60G and 60B of other electronic devices. In addition, the thickness t23 of the optical functional layer 60B of the third electronic device may be less than, for example thinner than, the thickness t22 of the optical functional layer 60G of the second electronic device.

The optical functional layer 60R of the first electronic device may have a thickness t21 of, for example, greater than or equal to about 65 nm, for example, greater than or equal to about 70 nm, for example, greater than or equal to about 75 nm, and for example, less than or equal to about 100 nm, for example, less than or equal to about 95 nm, for example, less than or equal to about 90 nm, for example, less than or equal to about 85 nm. In an embodiment, the thickness t21 can be about 65 nm to about 100 nm, about 70 nm to about 95 nm, about 75 nm to about 90 nm, or about 75 nm to about 85 nm.

In an example, the optical functional layer 60B of the third electronic device may have a thickness t23 of, for example, greater than or equal to about 30 nm, for example, greater than or equal to about 35 nm, greater than or equal to about 40 nm, and for example, less than or equal to about 70 nm, for example, less than or equal to about 65 nm, for example, less than or equal to about 60 nm, for example, less than or equal to about 55 nm. In an embodiment, the thickness t23 can be about 30 nm to about 70 nm, about 35 nm to about 65 nm, about 40 nm to about 60 nm, or about 40 nm to about 55 nm.

By providing different thicknesses of optical functional layers 60R, 60G, and 60B and/or different thicknesses of first charge transport layers 40R, 40G, and 40B, that correspond to the wavelength of each micro cavity of the first to third electronic devices 100R, 100G, and 100B, the first to third electronic devices 100R, 100G, and 100B may have different heights from each other.

However, an embodiment is not necessarily limited thereto, but the refractive indexes of the optical functional layers 60R, 60G, and 60B of devices are different from each other, or the first to third electronic devices 100R, 100G, and 100B may have the same height by adjusting the thicknesses of second charge transport layers 50R, 50G, and 50B, emission layers 30R, 30G, and 30B and the like.

As described herein, the display device 1000 according to an embodiment may express images having excellent color purity and color reproducibility through the quantum dot electro-luminescence element. In addition, as each device has excellent luminous efficiency through microcavity, the display device 1000 may express images having a high luminescence in a low power.

Hereinafter, the embodiments are illustrated in more detail with reference to examples. However, these examples are exemplary, and the present disclosure is not limited thereto.

EXAMPLES

Example 1

An ITO layer is deposited in a thickness of 10 nm on a silver (Ag) reflector having a thickness of 100 nm, and a ZnO layer is formed thereon in a thickness of 36 nm. Thereafter, blue quantum dots which are dispersed in an organic solvent are coated thereon in a thickness of 25 nm and then cured at 80° C. for 30 minutes under the nitrogen atmosphere to provide a blue emission layer. A 4,4',4"-tris (N-carbazolyl)-triphenylamine (TCTA) layer is formed on the obtained blue emission layer in a thickness of 25 nm, and a $MoO_3$ layer having a thickness of 10 nm and a magnesium-silver layer having a thickness of 12 nm are formed thereon. Then an optical functional layer including at least one of a triarylamine-based compound, a diarylamine-based compound, and a carbazole-based compound is formed on a magnesium-silver layer in a thickness of 51 nm to provide a blue light emitting element according to Example 1.

Example 2

A red light emitting element according to Example 2 is obtained in accordance with the same procedure as in Example 1, except that the ZnO layer is formed in a thickness of 60 nm instead of 36 nm; red quantum dots are dispersed in an organic solvent and coated instead of the blue quantum dots to provide a red emission layer; a carbazole-based compound-including layer is formed in a thickness of 52 nm instead of the TCTA layer; and the optical functional layer is formed in a thickness of 95 nm instead of the thickness of 51 nm.

Example 3

A red light emitting element according to Example 3 is obtained in accordance with the same procedure as in Example 2, except that the ZnO layer is formed in a thickness of 50 nm.

Example 4

A red light emitting element according to Example 4 is obtained in accordance with the same procedure as in Example 2, except that the ZnO layer is formed in a thickness of 55 nm.

Comparative Example 1

A poly(3,4-ethylenedioxythiophene):poly(styrene sulfonate) (PEDOT:PSS) layer having a thickness of 40 nm and a poly(9,9-dioctyl-fluorene-co-N-(4-butylphenyl)-diphenylamine) (TFB) layer having a thickness of 25 nm are formed on an indium tin oxide (ITO) electrode having a thickness of 150 nm. Blue quantum dots dispersed in an organic solvent are coated thereon in a thickness of 25 nm and then cured at 80° C. for 30 minutes under the nitrogen atmosphere to provide a blue emission layer. A ZnO layer having a thickness of 36 nm is formed thereon, and an Al layer is deposited in a thickness of 120 nm to provide a blue light emitting element.

Comparative Example 2

A red light emitting element according to Comparative Example 2 is prepared in accordance with the same procedure as in Comparative Example 1, except that the a carbazole-based compound-including layer is formed in a thickness of 50 nm instead of the TCTA layer as in Example 1; the red quantum dots are coated instead of the blue quantum dots to provide a red emission layer.

Comparative Example 3

A blue light emitting element according to Comparative Example 3 is prepared in accordance with the same procedure as in Example 1, except that CBP [4,4'-bis (9-carbazolyl)-1,1'-biphenyl] layer that Firpic[bis (4,6-difluorophenylpyridinato-N,C2')picolinate iridium(III)] is doped is formed in a thickness of 40 nm, instead of forming the blue emission layer including the blue quantum dots.

Evaluation 1: Spectral Radiance According to Wavelength Region of Example 1 and Comparative Example 1

Figure 4:
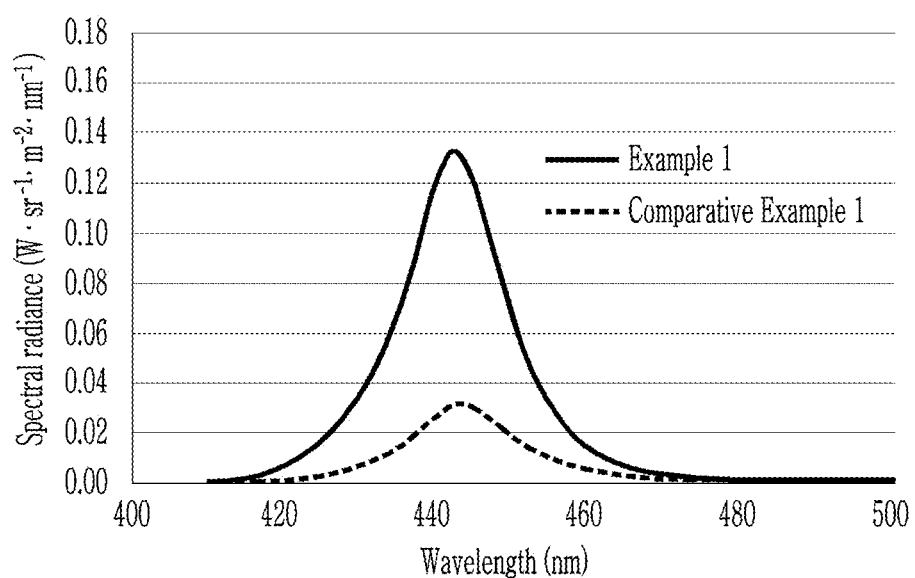
FIG. 4 is a graph of spectral radiance (watt per steradian per square meter per nanometer, W sr$^{-1}$ m$^{-2}$ nm$^{-1}$) versus wavelength (nanometer, nm) showing the spectral radiance according to a wavelength region in Example 1 and Comparative Example 1.

A voltage of 4 V is applied between the silver reflector and the ITO layer according to Example 1 and Comparative Example 1 to operate a light emitting element, and the spectral radiance is measured depending upon a wavelength region of light emitted from each light emitting element, and the results are shown in FIG. 4.

FIG. 4 is a graph showing a spectral radiance according to a wavelength region of Example 1 and Comparative Example 1.

Referring to FIG. 4, it is confirmed that Example 1 has a higher spectral radiance at a blue light wavelength region from about 420 nm to about 480 nm than Comparative Example 1, which is 3.9 times higher at a maximum wavelength ($\square_{max}$). In other words, it is confirmed that Example 1 provides a microcavity using the silver (Ag) reflector and the optical functional layer, so as to improve the light extraction efficiency for the blue light wavelength region compared to Comparative Example 1 having no microcavity structure.

Evaluation 2: Spectral Radiance According to Wavelength Region of Example 2 and Comparative Example 2

Figure 5:
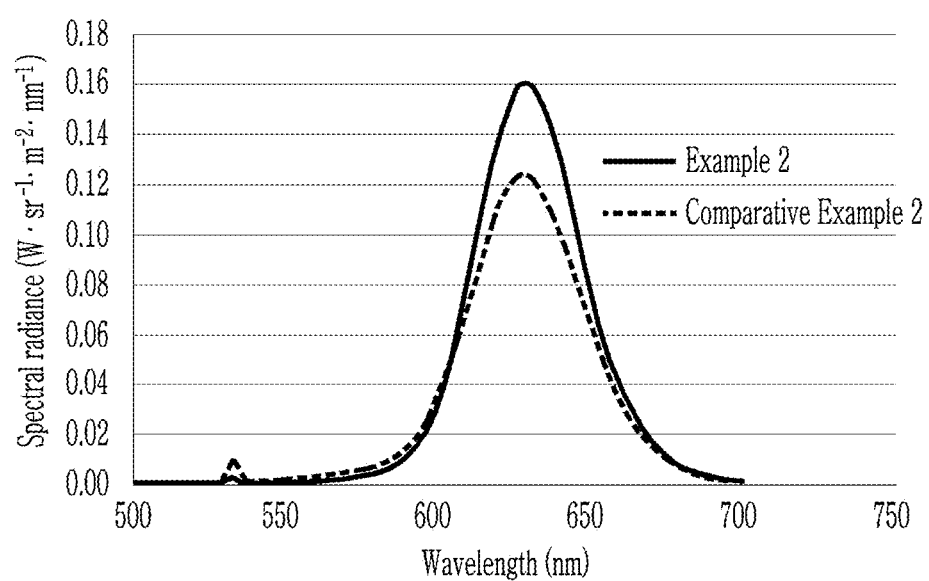
FIG. 5 is a graph of spectral radiance (W sr$^{-1}$ m$^{-2}$ nm$^{-1}$) versus wavelength (nm) showing the spectral radiance according to a wavelength region in Example 2 and Comparative Example 2.

A light emitting element is driven by applying voltage of 4V between the silver reflector and the ITO layer according to Example 2 and Comparative Example 2, and the spectral radiance of light emitted from each light emitting element is measured according to a wavelength region, and the results are shown in FIG. 5.

FIG. 5 is a graph showing a spectral radiance according to a wavelength region of Example 2 and Comparative Example 2.

Referring to FIG. 5, it is confirmed that Example 2 has a higher spectral radiance within a red light wavelength region from about 560 nm to about 700 nm than Comparative Example 2, which is 1.8 times higher at a $\square_{max}$. In other words, it is confirmed that Example 2 forms microcavity using the silver (Ag) reflector and the optical functional layer, as in Example 1, so the light extraction efficiency for the red light wavelength region may be improved, compared to Comparative Example 2 having no microcavity.

However, it is understood that the improving effects on the light extraction efficiency for the red light wavelength region is less significant than improving the effect on the light extraction efficiency for the blue light wavelength region. This is estimated because the light extraction of the blue wavelength is insignificantly increased compared to the red wavelength due to the structural characteristics of Example 2 and Comparative Example 2 having a bottom structure of element.

Evaluation 3: Comparison of Spectral Radiance and CIE xy Chromaticity Diagram According to Wavelength Region of Example 1 and Comparative Example 3

Figure 6:
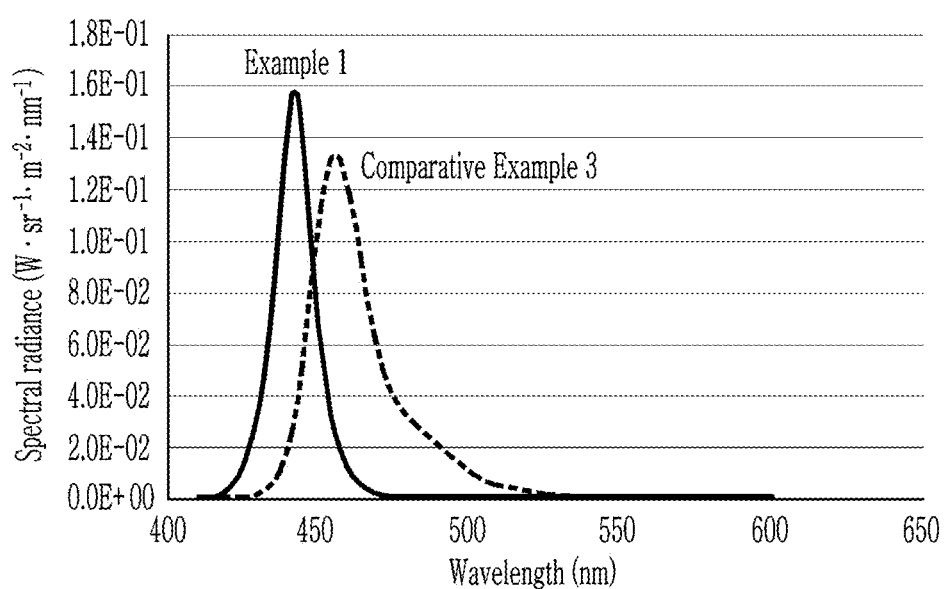
FIG. 6 is a graph of spectral radiance (W sr$^{-1}$ m$^{-2}$ nm$^{-1}$) versus wavelength (nm) showing the spectral radiance according to a wavelength region in Example 1 and Comparative Example 3.

The light emitting element is driven by applying voltage of 4V between the ITO layer and the reflector according to Example 1 and Comparative Example 3, and the spectral radiance of light emitted from each light emitting element is measured according to a wavelength region, and the results are shown in FIG. 6.

Figure 7:
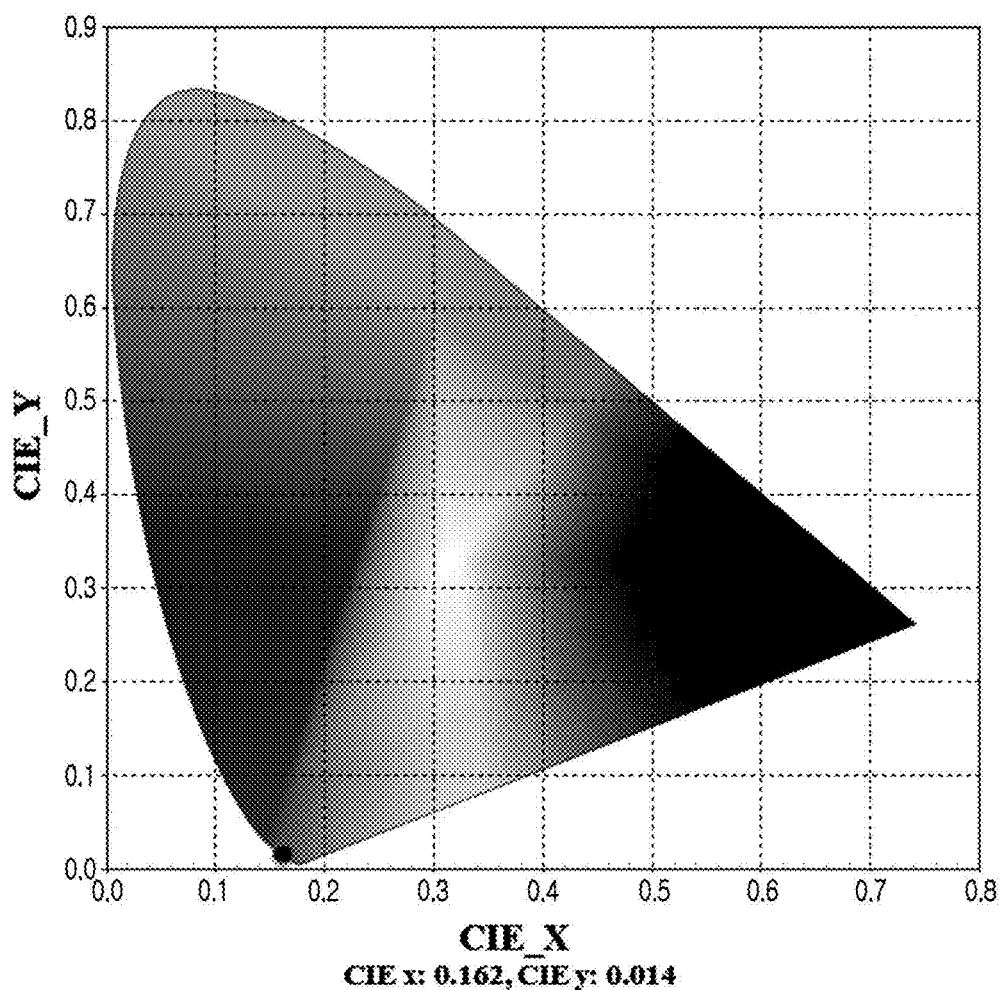
FIGS. 7 and 8 are graphs of CIE (y) versus CIE(x) showing CIE xy chromaticity coordinates for Example 1 and Comparative Example 3, respectively.
Figure 8:
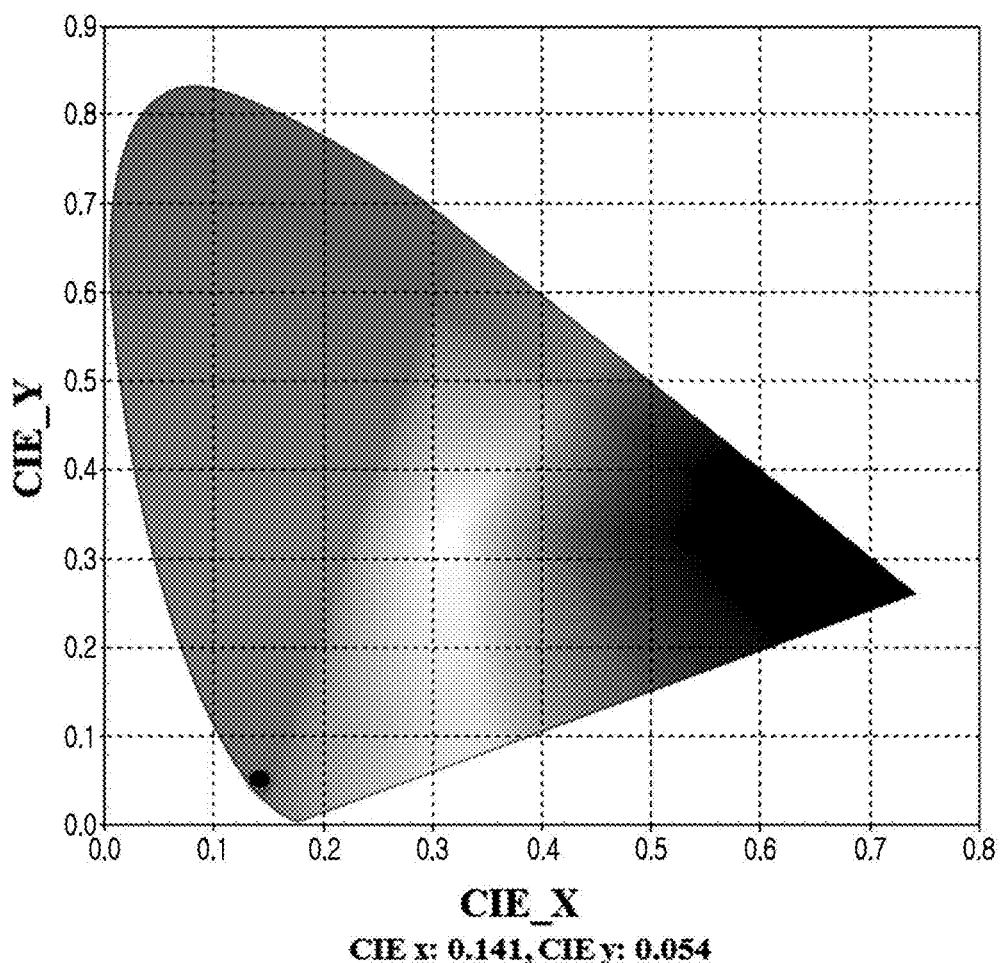

FIG. 6 is a graph showing a spectral radiance of Example 1 and Comparative Example 3 according to a wavelength region; FIG. 7 is a view showing a CIE xy chromaticity diagram for Example 1; and FIG. 8 is for Comparative Example 3.

Referring to FIG. 6, the quantum dot electro-luminescence device according to Example 1 shows a spectral radiance in about 12% higher than in Comparative Example 3 including the general organic light emitting diode, and it shows a full width at half maximum (FWHM) and a central wavelength lower than Comparative Example 3. Particularly, looking at and comparing FIGS. 7 and 8, the quantum dot electro-luminescence device according to Example 1 may emit clearer blue light than the general organic light emitting diode. In other words, the quantum dot electro-luminescence device of Example 1 may emit blue light having higher color reproducibility and color purity than Comparative Example 3.

Evaluation 4: Spectral Radiance According to Wavelength Region of Example 3 and Example 4

Figure 9:
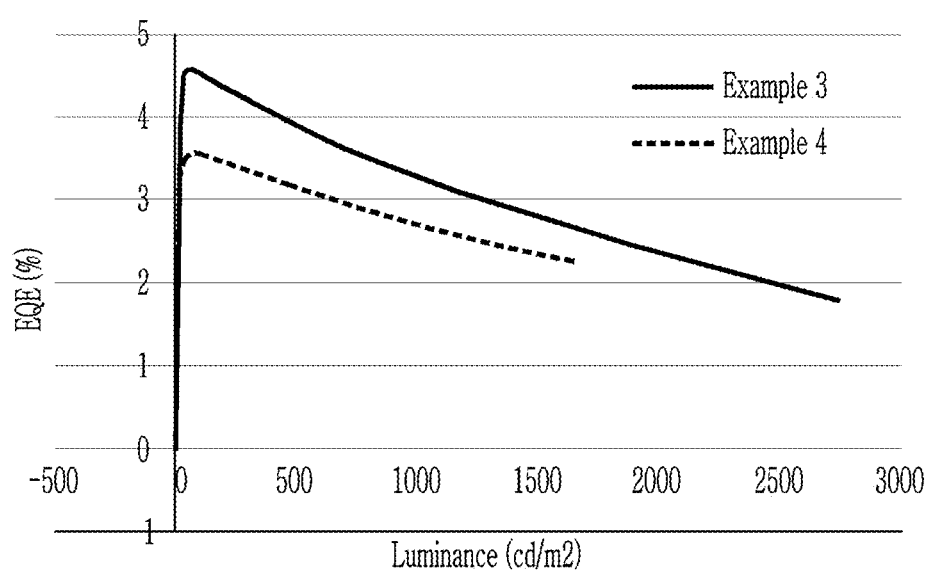
FIG. 9 is a graph of external quantum efficiency (EQE) (%) versus luminance (candela per square meter, cd/m$^2$) showing the change in external quantum efficiency (EQE) according to luminance of Example 3 and Example 4.

The light emitting element is driven by applying voltage of 4 V to 6 V between the ITO layer of the silver reflector according to Example 3 and Example 4, and the spectral radiance according to wavelength region of light emitted from each light emitting element is measured, and the results are shown in FIG. 9.

The vertical axis in FIG. 9 indicates an external quantum efficiency, which is obtained by measuring a current density and a luminescence at the applied voltage and calculating based on the same.

FIG. 9 is a graph showing external quantum efficiency (EQE) according to a luminescence in Example 3 and Example 4.

Referring to FIG. 9, it is confirmed that both Example 3 and Example 4 show quantum efficiency of greater than 3% at a luminescence of near to 0 cd/m$^2$. Thereby, in the case of the electronic device formed with micro cavity according to an embodiment, it is confirmed that the external quantum efficiency of the electronic device may be changed by only adjusting the thickness of ZnO layer without changing other conditions.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electronic device comprising
a first electrode and a second electrode facing each other;
an emission layer comprising a plurality of quantum dots, wherein the emission layer is disposed between the first electrode and the second electrode;
a first charge auxiliary layer disposed between the first electrode and the emission layer and comprising an electron transport layer; and
an optical functional layer disposed on the second electrode on a side opposite the emission layer and having a thickness of about 30 nanometers to about 70 nanometers,
wherein the first electrode comprises a reflecting electrode,
wherein the second electrode is a light-transmitting electrode,
wherein the emission layer emits a blue light and the thickness of the electron transport layer ranges from about 25 nanometers to about 45 nanometers, and
wherein the total thickness of the optical functional layer and the electron transport layer ranges from about 60 nanometers to about 110 nanometers.

2. The electronic device of claim 1, wherein the refractive index of the optical functional layer ranges from about 1.5 to about 2.5.

3. The electronic device of claim 1, wherein the optical functional layer comprises a triarylamine compound, a diarylamine compound, a carbazole compound, or a combination thereof.

4. The electronic device of claim 1, wherein the thickness of the optical functional layer ranges from about 40 nanometers to about 60 nanometers.

5. The electronic device of claim 1, wherein the electron transport layer comprises a zinc oxide, a molybdenum oxide, a tungsten oxide, a nickel oxide, or a combination thereof.

6. The electronic device of claim 1, wherein the first electrode comprises a first layer having a work function of about 4.2 electron volts to about 4.7 electron volts, and an optically opaque second layer.

7. The electronic device of claim 6, wherein the first layer comprises an indium-tin oxide, an indium-zinc oxide, magnesium-silver, aluminum-lithium, magnesium-indium, an indium oxide, a tin oxide, a gallium oxide, a zinc oxide, or a combination thereof, and the second layer comprises silver, aluminum, zinc, gold, iridium, copper, platinum, or a combination thereof.

8. The electronic device of claim 6, wherein the second layer comprises silver, aluminum, zinc, gold, iridium, copper, platinum, or a combination thereof.

9. The electronic device of claim 1, wherein the quantum dots comprise a Group II-VI compound, a Group III-V compound, a Group IV-VI compound, a Group IV compound, a Group II-III-VI compound, a Group I-II-IV-VI compound, or a combination thereof.

10. An electronic device comprising
a first electrode and a second electrode facing each other;
an emission layer comprising a plurality of quantum dots, wherein the emission layer is disposed between the first electrode and the second electrode;
a first charge auxiliary layer disposed between the first electrode and the emission layer and comprising an electron transport layer; and
an optical functional layer disposed on the second electrode on a side opposite the emission layer and having a thickness of about 30 nanometers to about 100 nanometers,
wherein the first electrode comprises a reflecting electrode,
wherein the second electrode is a light-transmitting electrode, and
wherein the emission layer emits a red light and the thickness of the electron transport layer ranges from about 45 nanometers to about 80 nanometers, and
wherein the total thickness of the optical functional layer and the electron transport layer ranges from about 110 nanometers to about 165 nanometers.

11. The electronic device of claim 10, wherein the refractive index of the optical functional layer ranges from about 1.5 to about 2.5.

12. The electronic device of claim 10, wherein the optical functional layer comprises a triarylamine compound, a diarylamine compound, a carbazole compound, or a combination thereof.

13. The electronic device of claim 10, wherein the thickness of the optical functional layer ranges from about 70 nanometers to about 95 nanometers.

14. The electronic device of claim 10, wherein the electron transport layer comprises a zinc oxide, a molybdenum oxide, a tungsten oxide, a nickel oxide, or a combination thereof.

15. The electronic device of claim 10, wherein the first electrode comprises a first layer having a work function of about 4.2 electron volts to about 4.7 electron volts, and an optically opaque second layer.

16. The electronic device of claim 15, wherein the first layer comprises an indium-tin oxide, an indium-zinc oxide, magnesium-silver, aluminum-lithium, magnesium-indium, an indium oxide, a tin oxide, a gallium oxide, a zinc oxide, or a combination thereof, and the second layer comprises silver, aluminum, zinc, gold, iridium, copper, platinum, or a combination thereof.

17. The electronic device of claim 15, wherein the second layer comprises silver, aluminum, zinc, gold, iridium, copper, platinum, or a combination thereof.

18. The electronic device of claim 10, wherein the quantum dots comprise a Group II-VI compound, a Group III-V compound, a Group IV-VI compound, a Group IV compound, a Group II-III-VI compound, a Group I-II-IV-VI compound, or a combination thereof.

19. The electronic device of claim 10, wherein the thickness of the electron transport layer ranges from about 45 nanometers to about 65 nanometers.

20. A display device comprising
a first electronic device comprising a first quantum dot emitting light in a first wavelength region;
a second electronic device comprising a second quantum dot emitting light in a shorter second wavelength region than the first wavelength region; and
and a third electronic device comprising a third quantum dot emitting light in a shorter third wavelength region than the second wavelength region,
wherein each of the first electronic device, the second electronic device, and the third electronic device further comprises:
a first electrode and a second electrode facing each other,
an emission layer disposed between the first electrode and the second electrode, wherein the emission layer comprises the first quantum dot, the second quantum dot, or the third quantum dot,
a charge transport layer disposed between the emission layer and the first electrode, and
an optical functional layer disposed on the second electrode on a side opposite the emission layer,
wherein the first electrode comprises a reflecting electrode,
wherein the second electrode is a light-transmitting electrode,
wherein a thickness of the charge transport layer of the first electronic device, a thickness of the charge transport layer of the second electronic device, and a thickness of the charge transport layer of the third electronic device are different,
wherein the thickness of the charge transport layer of the first electronic device ranges from about 45 nanometers to about 80 nanometers, and
wherein the thickness of the charge transport layer of the third electronic device ranges from about 25 nanometers to about 45 nanometers.

21. The display device of claim 20, wherein the refractive index of the optical functional layer ranges from about 1.5 to about 2.5.

22. The display device of claim 20, wherein the thickness of the charge transport layer of the third electronic device is less than the thickness of the charge transport layer of the second electronic device.

23. The display device of claim 20, wherein the thickness of the optical functional layer of the first electronic device, the thickness of the optical functional layer of the second electronic device, and the thickness of the optical functional layer of the third electronic device are different.

24. The display device of claim 23, wherein the thickness of the optical functional layer of the first electronic device is greater than the thickness of the optical functional layer of the second electronic device and the thickness of the optical functional layer of the third electronic device.

25. The display device of claim 24, wherein the thickness of the optical functional layer of the third electronic device is less than the thickness of the optical functional layer of the second electronic device.

* * * * *